United States Patent
Roy et al.

(12) 
(10) Patent No.: US 6,440,829 B1
(45) Date of Patent: Aug. 27, 2002

(54) N-PROFILE ENGINEERING AT THE POLY/GATE OXIDE AND GATE OXIDE/SI INTERFACES THROUGH NH₃ ANNEALING OF A LAYERED POLY/AMORPHOUS-SILICON STRUCTURE

(75) Inventors: Pradip K. Roy; Yi Ma; Michael A. Laughery, all of Orlando, FL (US)

(73) Assignee: Agere Systems Guardian Corp., Allentown, PA (US)

( * ) Notice: Subject to any disclaimer, the term of this patent is extended or adjusted under 35 U.S.C. 154(b) by 0 days.

(21) Appl. No.: 09/223,354

(22) Filed: Dec. 30, 1998

(51) Int. Cl.⁷ .................. H01L 21/3205; H01L 21/4763
(52) U.S. Cl. ...................... 438/592; 438/653; 438/657; 438/660; 438/775
(58) Field of Search ................ 438/652, 565, 438/542, 921, 922, 923, 585, 775, 660, 592, 657, 653, 588

(56) References Cited

U.S. PATENT DOCUMENTS

| | | | |
|---|---|---|---|
| 5,147,820 A | | 9/1992 | Chittipeddi et al. ........ 437/193 |
| 5,298,436 A | | 3/1994 | Radosevich et al. .......... 437/29 |
| 5,514,902 A | * | 5/1996 | Kawasaki et al. .......... 257/607 |
| 5,567,638 A | * | 10/1996 | Lin et al. .................... 438/592 |
| 5,648,673 A | * | 7/1997 | Yasuda ........................ 257/382 |
| 5,767,004 A | * | 6/1998 | Balasubramanian et al. .......................... 438/592 |
| 5,783,469 A | * | 7/1998 | Gardner et al. ............. 438/199 |
| 5,877,057 A | * | 3/1999 | Gardner et al. ............. 438/301 |
| 5,879,975 A | * | 3/1999 | Karlsson et al. ............ 438/162 |
| 5,885,877 A | * | 3/1999 | Gardner et al. ............. 438/300 |
| 5,959,333 A | * | 9/1999 | Gardner et al. ............. 257/372 |
| 6,020,260 A | * | 2/2000 | Gardner ...................... 438/657 |
| 6,147,388 A | * | 11/2000 | Ma et al. .................... 257/412 |

FOREIGN PATENT DOCUMENTS

| JP | 7-176743 | * 7/1995 |
|---|---|---|
| JP | 10-308361 | * 10/1998 |

* cited by examiner

Primary Examiner—Olik Chaudhuri
Assistant Examiner—Kurt Eaton
(74) Attorney, Agent, or Firm—Christie, Parker & Hale, LLP

(57) ABSTRACT

A method and structure providing N-profile engineering at the poly/gate oxide and gate oxide/Si interfaces of a layered polysilicon/amorphous silicon structure of a semiconductor device. NH₃ annealing provides for the introduction of nitrogen to the interface, where the nitrogen suppresses Boron diffusion, improves gate oxide integrity, and reduces the sites available for trapping hot carriers which degrade device performance.

24 Claims, 2 Drawing Sheets

N-PROFILE ENGINEERING AT THE POLY/GATE OXIDE AND GATE OXIDE/SI INTERFACES THROUGH NH₃ ANNEALING OF A LAYERED POLY/AMORPHOUS-SILICON STRUCTURE

FIELD OF THE INVENTION

This invention relates to semiconductor integrated circuit devices, most generally, and the processes for forming these devices. More specifically, this invention relates to the materials, processes, and structures used to suppress Boron penetration from a $p^+$ doped polysilicon structure through gate areas and into channel areas.

BACKGROUND OF THE INVENTION

Semiconductor integrated circuit devices include a thin dielectric material, commonly a thermally grown oxide, which functions as a gate dielectric for transistors incorporated into semiconductor integrated circuit devices. The gate dielectric material is typically formed on a semiconductor substrate over a region which will serve as a channel region. The transistors function when a channel is formed in the semiconductor substrate beneath the gate dielectric in response to a current being applied to a gate electrode formed atop the gate dielectric film. The quality and integrity of the gate dielectric film is critical to the functionality of the transistor devices, which include a very tightly defined set of operational characteristics which are very sensitive to the materials and methods used to form the transistor devices. It is important, therefore, to suppress the migration of any undesired dopant species into the gate dielectric film.

Polycrystalline silicon films are commonly used as interconnect materials and as the gates for transistors in semiconductor integrated circuits. Polycrystalline silicon is commonly "p-type" polycrystalline silicon. By "p-type" polysilicon material, it is meant that a p-type impurity is introduced into the polycrystalline silicon film. A commonly used, and preferred p-type dopant within the semiconductor industry is Boron. When Boron is used as an impurity dopant within a polycrystalline silicon film, it is of critical significance to maintain the Boron within the polycrystalline silicon film, and especially to suppress migration of this Boron dopant into the gate dielectric film which forms part of the transistor.

In addition to Boron diffusing into the gate dielectric material, the Boron can further diffuse through the gate dielectric material and into the channel region of the transistor formed below the gate dielectric region. When this occurs, device functionality can be destroyed. It is thus of increased significance to suppress the diffusion of Boron from the polysilicon interconnect and gate structures. Boron diffusion occurs during process steps which utilize elevated temperatures, and also during the operation of the completed device. It is therefore desirable to have a built-in means within the gate electrode/gate dielectric structure which will suppress Boron diffusion out of the polycrystalline silicon and into or through the gate dielectric material.

One approach to suppressing Boron diffusion as above, is to utilize a gate dielectric film which includes both an oxide film and a nitride film. An alternate, but similar approach utilizes an oxide film, a nitride film, and a second oxide film. While the combination of an oxide and nitride film to form a gate dielectric may be successful in suppressing Boron penetration from $p^+$ polysilicon into the underlying channel region, these gate structures introduce charge trapping and channel mobility problems. Completely formed nitride films, or completely formed nitride films in conjunction with oxide films, are therefore not desirable gate dielectric materials.

Because of the above problems associated with Boron diffusion, and the shortcomings of the contemporary attempts to suppress this diffusion by adding a nitride film into the gate material, there is a demonstrated need in the art to provide a process and structure which suppresses Boron penetration from $p^+$ polysilicon through gate areas and into channel areas without compromising silicide integrity, and while simultaneously improving gate oxide wear out and hot carrier aging behavior.

SUMMARY OF THE INVENTION

To achieve these and other objects, and in view of its proposes, the present invention addresses the shortcomings of the conventional attempts of suppressing Boron penetration without compromising the integrity of a subsequently formed silicide film. The present invention provides a process for ammonia annealing on a layered polysilicon/amorphous silicon structure onto which a silicide film may subsequently be formed. The layering feature results in stress accommodation and prevents abnormal grain growth during the re-crystallization of amorphous silicon as it becomes converted into polycrystalline silicon. The ammonia annealing urges the formation of a thin nitrogen impurity layer near the top layer of a gate dielectric material and at the interface between the gate dielectric material and the bottom of the layered silicon gate structure. The presence of this nitrogen impurity suppresses the diffusion of Boron from $p^+$ polysilicon, and through a dielectric gate and into the channel area. Additionally, the nitrogen impurity suppresses Boron penetration without compromising silicide integrity. This nitrogen impurity simultaneously enhances gate oxide integrity and improves gate oxide wear out characteristics and hot carrier aging behavior by reducing the density of sites available in the gate oxide for trapping charges. The present invention also prevents the charge trapping and channel mobility problems associated with a nitride gate dielectric film formed using conventional methods. The present invention finds application in any dual or multi-layer silicon films in various technologies including CMOS and bi-CMOS technologies.

DETAILED DESCRIPTION OF THE INVENTION

Figure 1:
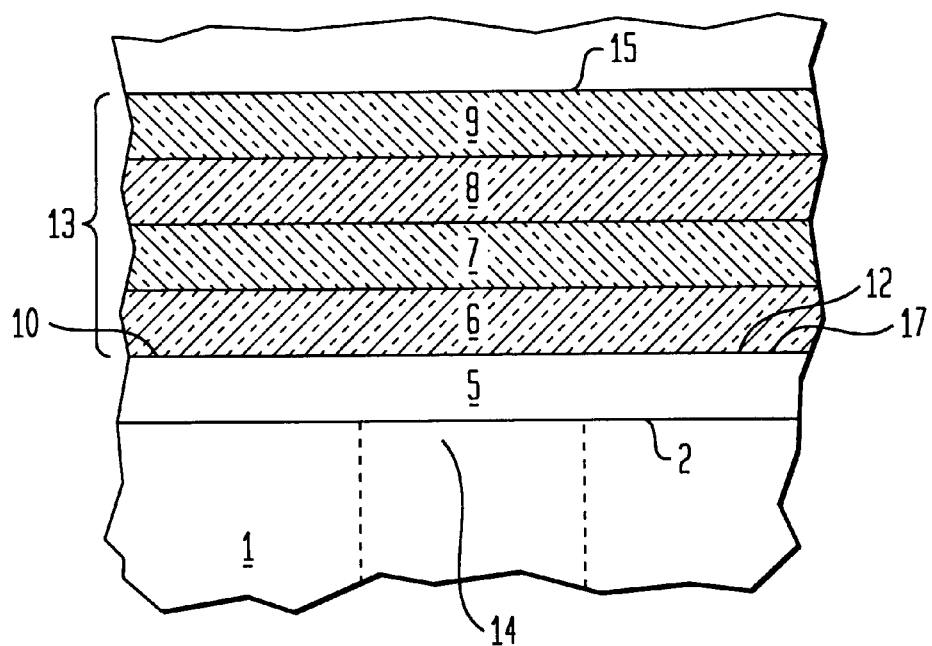
FIG. 1 is a cross-section of an exemplary embodiment of the present invention, showing a plurality of sublayers formed on a gate dielectric material.

FIG. 1 shows a cross-section of an exemplary embodiment of a structure on which the process of the present invention may be used. A gate dielectric film 5 is formed on surface 2 of substrate 1. Region 14 within substrate 1 will form the channel region of a transistor device which will be formed subsequently. In an alternative embodiment, a dopant impurity may be included within substrate 1, at or near upper surface 2. In the exemplary structure shown, four silicon sublayers 6, 7, 8 and 9 combine to form the doped semiconductor layer 13. Doped semiconductor layer 13 includes an upper surface 15. The gate dielectric film 5 may be a thermally grown oxide film according to the preferred embodiment. Because of the method of the present invention, a nitride film formed within or on top of gate dielectric film 5 will not be necessary. Bottom semiconductor sublayer 6 is formed on the top surface 10 of the gate dielectric film 5. Bottom surface 12 of bottom semiconductor sublayer 6 combines with upper surface 10 of gate dielectric 5 to form an interface region 17. In an alternate embodiment, doped semiconductor layer 13 may be comprised of greater or fewer than four semiconductor sublayers, as in the exemplary embodiment.

The semiconductor sublayers may include sublayers which may be polycrystalline silicon or amorphous silicon as deposited. Bottom semiconductor sublayer 6 may comprise either an amorphous polysilicon film, or a polycrystalline silicon film as deposited. The semiconductor sublayers may be deposited onto substrate 1 by any method suitable in the art. In the preferred embodiment, low pressure chemical vapor deposition (LPCVD) will be used to form the films. A film which is polycrystalline silicon as deposited, may differ from an otherwise similar film which is amorphous silicon as deposited, solely because of different deposition conditions. In the preferred embodiment, the as-deposited films will alternate between amorphous silicon and polycrystalline silicon. The practice of using a series of semiconductor sublayers consisting of alternating polycrystalline silicon and amorphous silicon films, is used to relieve device stress. This method of using sublayers is as described in U.S. Pat. No. 5,298,436 issued to Radosevich et al. which is incorporated herein by reference. One advantage of using alternating films is the reduced stress which is created upon the structure itself. This technique also provides for an ordered grain structuring during subsequent heat treatment procedures which convert the film which is amorphous silicon as deposited, into a structured film comprising polycrystalline silicon ("polysilicon").

The deposited silicon films of each sublayer may be either polysilicon or amorphous silicon as deposited. The use of amorphous silicon has the known advantage of producing a relatively smooth surface as compared to polysilicon. Alternatively or additionally, some of the deposited layers which may be polysilicon as deposited, may have different silicon grain structures. As is known in the art, the is size of the silicon grains generally decreases at lower temperatures and the deposited silicon becomes amorphous at temperatures below about 570° C. Heating steps which comprise standard integrated circuit production processes performed subsequent to the deposition step, cause the nucleation and growth of silicon grains, thereby converting the amorphous silicon into polysilicon.

The conversion of the amorphous silicon into polycrystalline silicon films will occur during the ammonia anneal process as will be seen later. Of the semiconductor sublayers 6, 7, 8 and 9, one, several, or all may include Boron doping. Boron is p-type dopant common in the semiconductor industry and is a preferred dopant species in many device applications. Any suitable method for introducing a Boron dopant impurity into any or all of the sublayers may be used. Alternatively, the Boron doping may take place after the formation of the doped semiconductor layer 13 as shown. In that case, a Boron dopant may be introduced into doped semiconductor layer 13 through upper surface 15. In the preferred embodiment, ion-implantation may be used to introduce impurities into doped semiconductor layer 13, but other doping methods may be used. In an alternative embodiment, a p-type dopant species other than Boron, may be used as the dopant impurity.

Figure 2:
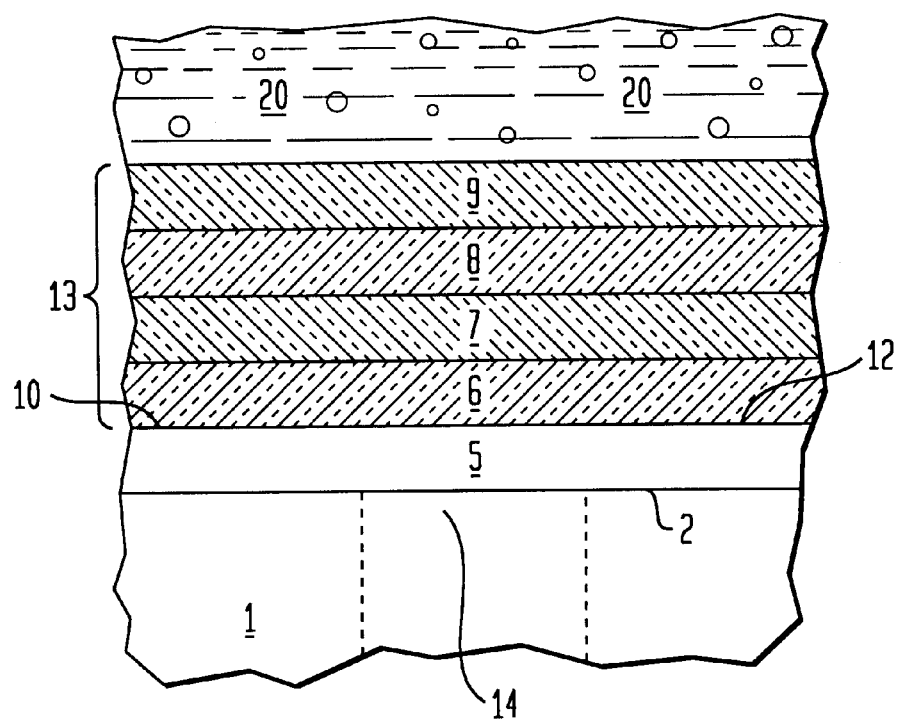
FIG. 2 is a cross-section showing the exemplary embodiment of FIG. 1 heat treated using ammonia gas.

Now turning to FIG. 2, the exemplary doped semiconductor layer 13 is shown subjected to a gas 20 which includes ammonia ($NH_3$). In the preferred embodiment, the ammonia ambient will be provided to the substrate by means of a carrier gas. The carrier gas may include argon, helium, or nitrogen, as well as the ammonia. During the time in which the substrate is exposed to the ammonia-containing gas, the annealing process is carried out. In the preferred embodiment, the annealing process may take place in a conventional furnace tube, as used in the semiconductor processing industry. In the preferred embodiment, the annealing conditions may include a temperature within the range of 700° C. to 900° C., a pressure of less than one torr, and an annealing time of 15 to 60 minutes. It should be understood by one skilled in the art, that the annealing conditions may be varied, in response to the different characteristics of doped semiconductor layer 13.

Figure 3:
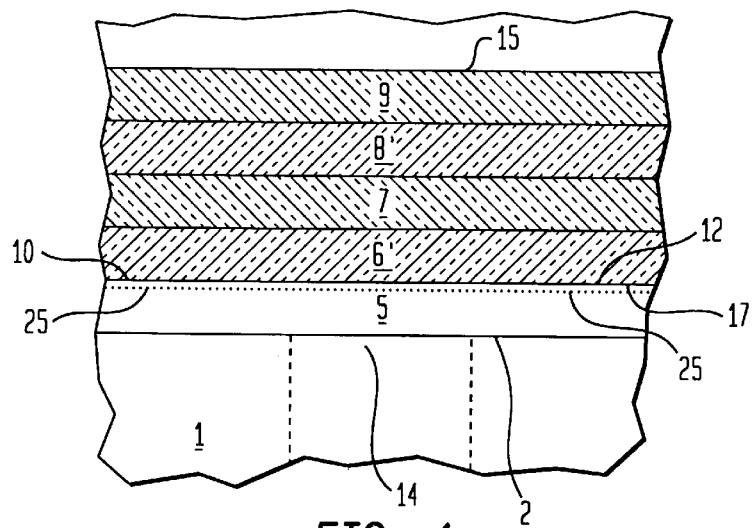
FIG. 3 is a cross-section showing the subsequent step in the processing sequence, wherein nitrogen impurities have been introduced into the gate dielectric film.

Now turning to FIG. 3, a nitrogen impurity 25 has been added to interface 17 as a result of the annealing process as described above. In the preferred embodiment, the concentration of the nitrogen impurity at the interface may lie within the range of $1.0 \times 10^{20}$–$1.0 \times 10^{21}$ atoms/centimeter. However, other levels of nitrogen concentration may be achieved. In fact, various nitrogen impurity levels may be desired, based upon the subsequent processing conditions, the gate oxide dielectric, doped semiconductor layer 13, and the concentration of the $p^+$ impurity formed within doped semiconductor layer 13. It is this dopant nitride impurity 25 which prevents p-type dopant impurities (for example Boron) from semiconductor layer 13 to diffuse into the gate dielectric film 5 and further diffuse into region 14 of semiconductor substrate 1, which will later serve as the channel region of a transistor device to be formed subsequently. The presence of the nitrogen impurity 25 also reduces the density of sites available in the gate oxide region to trap charges. As such, gate oxide integrity is enhanced and hot carrier effects are reduced.

In the preferred embodiment, semiconductor sublayers 6 and 8 may be amorphous silicon as deposited, and semiconductor sublayers 7 and 9 may be polycrystalline silicon as deposited. This layering effect minimizes stress associated with the device, as described above. After the four semiconductor sublayer films 6, 7, 8 and 9 have been formed, the annealing process, as described above, is used to both provide a concentration of nitrogen 25 at interface region 17, and simultaneously convert amorphous silicon films 6 and 8 into converted polycrystalline silicon films 6' and 8'. The conversion of semiconductor sublayers 6 and 8 may be complete or may be partial. In any event, N-profile engineering has been used to form nitrogen impurities 25 at interface region 17. Interface region 17 may be interposed between a gate oxide and an amorphous silicon film, or between a gate oxide and a polycrystalline silicon film, depending on structure of the bottom layer as deposited, and further depending upon the completeness of conversion as above, if the bottom film 6 is amorphous silicon as deposited.

Figure 4:
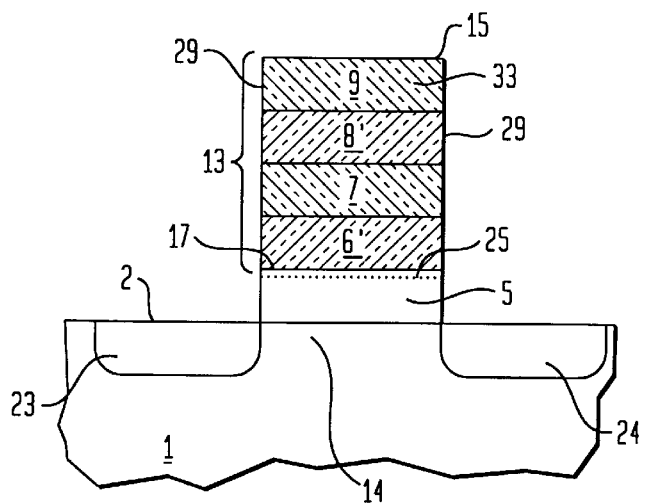
FIG. 4 is a cross-section showing a transistor formed using the structure of the present invention.

FIG. 4 shows a cross-section of a transistor device using the nitrogen profile engineering of the present invention at interface region 17 formed between the bottom semiconductor sublayer 6 and the gate dielectric film 5. A semiconductor gate structure 33 is formed of doped semiconductor structure 13, which is comprised of semiconductor sublayers 6', 7, 8' and 9. Gate structure 33 is shown after portions of doped semiconductor layer 13 have been removed. The method for forming semiconductor gate 33 from doped semiconductor layer 13 may be any patterning procedure suitable in the art. In the preferred embodiment, a photolithographically sensitive film may be formed on the top surface 15 of the doped semiconductor layer 13 shown in FIG. 3, and a pattern may be formed within the photolithographically sensitive film (not shown). Next, the semiconductor layer 13 and gate dielectric 5 may be removed by etching methods suitable in the art. After these films have been removed, the photolithographically sensitive film (not shown) may be removed. Any suitable method for removing a photolithographically sensitive film known in the art, may be used. Gate electrode structure 33 as formed, includes sidewalls 29, and a top surface 15. After gate electrode 33 has been formed, source/drain regions 23 and 24 may be formed within surface 2 of semiconductor substrate 1. Any method suitable in the art may be used to introduce impurities into surface 2 and to form source/drain regions 23 and 24. In an exemplary embodiment, ion implantation may be used. In this exemplary embodiment produced by the process of the present invention as described herein, the current invention is used in conjunction with a transistor as shown in FIG. 4. It should be understood by one skilled in the art, that this process for introducing nitrogen profiling at the gate interface, may find application within various other structures within a semiconductor device.

Figure 5:
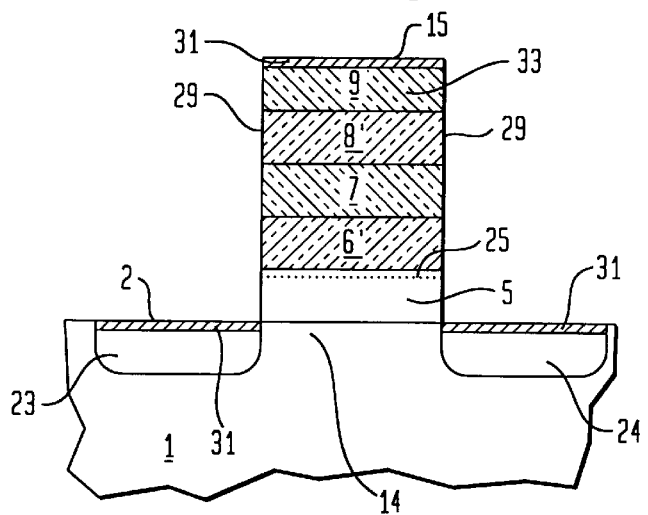
FIG. 5 is a cross-section showing an alternative embodiment of the structure of FIG. 4 including a silicide film.

FIG. 5 represents an alternate embodiment of the transistor structure shown in FIG. 4. In FIG. 5, the transistor structure includes a silicide film 31 which is formed on the top surface 15 of gate electrode 33, as well as on top surface 2 of source drain regions 23 and 24. Silicide film 31 may be formed by simultaneously depositing a refractory metal film on the exposed top surface 15 of the gate electrode 33, and the top surface 2 of source drain regions 23 and 24. A subsequent heat treatment process is then performed to urge the combination of the exposed silicon and the deposited refractory materials to form a silicide film over the top surface 15 and top surfaces 2.

An advantage of the present invention is realized during the heat treatment processes associated with silicide formation, as well as during other heat treatment processes. The nitrogen impurities added to the interface by the methods of the present invention, suppress the migration of the p-type dopant species such as Boron, from the doped semiconductor layer, and into or through the gate dielectric during the heat treatment process steps.

The preceding description merely illustrates the principles of the invention. It will thus be appreciated that those skilled in the art will be able to devise various arrangements which, although not explicitly described or shown herein, embody the principles of the invention and are included within its spirit and scope. Furthermore, all examples and conditional language recited herein are principally intended expressly to be only for pedagogical purposes to aid the reader in understanding the principles of the invention and the concepts contributed by the inventor(s) to furthering the art, and are to be construed as being without limitation to such specifically recited examples and conditions. Moreover, all statements herein reciting principles, aspects, and embodiments of the invention, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

As such, the invention is not intended to be limited to the details shown. Rather, various modifications and additions may be made in the details within the scope and range of equivalents of the claims and without departing from the invention.

What is claimed:

1. A method for forming a semiconductor structure within a semiconductor device, comprising the steps of:
   a. providing a semiconductor substrate;
   b. forming a dielectric film on said substrate, said dielectric film having an upper surface;
   c. sequentially forming a plurality of semiconductor sublayers including a bottom semiconductor sublayers on said upper surface of said dielectric film, said plurality of semiconductor sublayers including a bottom semiconductor sublayer having a lower surface forming an interface region with said upper surface of said dielectric film and thereby forming a layered structure; and
   d. adding nitrogen to said interface region by annealing said layered structure in $NH_3$ not prior to the completion of said step of sequentially forming said plurality of semiconductor sublayers.

2. The method as in claim 1, wherein said forming a dielectric film comprises thermally oxidizing said substrate.

3. The method as in claim 2, wherein said step of forming a doped semiconductor layer comprises forming a gate electrode of a transistor, and said step of thermally oxidizing said substrate comprises forming a gate oxide of said transistor.

4. The method as in claim 1, in which step c) further includes introducing a dopant impurity other than nitrogen into said layered structure.

5. The method as in claim 4, wherein said dopant impurity comprises boron.

6. The method as in claim 1, wherein said sequentially forming a plurality of semiconductor sublayers includes forming at least one polycrystalline sublayer, and forming at least one amorphous silicon sublayer.

7. The method as in claim 6, wherein said bottom semiconductor sublayer comprises amorphous silicon.

8. The method as in claim 6, wherein said bottom semiconductor sublayer comprises polycrystalline silicon.

9. The method as in claim 6, in which step d) includes simultaneously converting at least part of each of said at least one amorphous silicon sub layer to a converted polycrystalline silicon sublayer.

10. The method as in claim 1, in which step c) further includes doping at least one of said plurality of semiconductor sublayers with a dopant impurity species being other than nitrogen.

11. The method as in claim 10, wherein said doping comprises doping with boron.

12. The method as in claim 1, further comprising the step e) of forming a silicide film on said doped semiconductor layer.

13. The method as in claim 12, wherein said silicide film comprises a metal silicide including a metal selected from the group of cobalt, tungsten, titanium, molybdenum, and tantalum.

14. The method as in claim 12, in which step d) includes creating a pattern of said doped semiconductor layer to form a transistor gate and to expose a surface of said substrate, and forming source and drain regions within said surface, and step e) includes simultaneously forming a silicide film on said source and drain regions.

15. The method as in claim 1, wherein said annealing comprises annealing at a temperature within a range of 700° C. to 900° C.

16. The method as in claim 1, wherein said annealing comprises annealing at a pressure less than one Torr.

17. The method as in claim 1, wherein said annealing comprises annealing for a time within the range of 15 minutes to 60 minutes.

18. The method as in claim 1, in which step d) includes providing a source gas including $NH_3$ and a carrier gas.

19. The method as in claim 18, wherein said carrier gas comprises one of argon, helium, and nitrogen.

20. The method as in claim 1, wherein said semiconductor device comprises a charge coupled device (CCD).

21. The method as in claim 1, wherein said semiconductor device comprises an electrically erasable programmable read only memory ($E^2$ PROM) device.

22. The method as in claim 1, wherein said semiconductor device comprises a CMOS device.

23. The method as in claim 1, wherein a nitrogen concentration at said interface region is within a range of 10E20–10E21 atoms/$cm^3$.

24. A semiconductor structure formed according to the method as in claim 1.

* * * * *

UNITED STATES PATENT AND TRADEMARK OFFICE
CERTIFICATE OF CORRECTION

PATENT NO.    : 6,440,829 B1                                                Page 1 of 1
DATED         : August 27, 2002
INVENTOR(S)   : Pradip K. Roy, Yi Ma and Michael A. Laughery It is certified that error appears in the above-identified patent and that said Letters Patent is hereby corrected as shown below:

Column 6,
Line 17, after "layers" delete "including a bottom semiconductor sublayers".
Line 49, replace "sub layer" with -- sublayer --.

Column 7,
Line 5, replace "C. to 900º C." with -- C to 900º C." --.

Signed and Sealed this

Twenty-sixth Day of August, 2003

JAMES E. ROGAN
*Director of the United States Patent and Trademark Office*